(12) United States Patent
Kurosawa et al.

(10) Patent No.: US 7,638,858 B2
(45) Date of Patent: Dec. 29, 2009

(54) SEMICONDUCTOR DEVICE AND MANUFACTURING METHOD THEREOF

(75) Inventors: Tetsuya Kurosawa, Kanagawa (JP); Yoshihisa Imori, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/730,949

(22) Filed: Apr. 5, 2007

(65) Prior Publication Data

US 2007/0187802 A1 Aug. 16, 2007

Related U.S. Application Data

(62) Division of application No. 10/845,232, filed on May 14, 2004, now Pat. No. 7,217,640.

(30) Foreign Application Priority Data

May 16, 2003 (JP) ............................. 2003-138889

(51) Int. Cl.
*H01L 21/46* (2006.01)
(52) U.S. Cl. ................. 257/622; 257/620; 257/730; 257/E21.599; 257/E21.237; 257/E21.238
(58) Field of Classification Search ................. 257/620, 257/343, E21.599, E21.238, E21.237; 438/113–114
See application file for complete search history.

(56) References Cited

U.S. PATENT DOCUMENTS

| | | | | |
|---|---|---|---|---|
| 4,237,601 A * | 12/1980 | Woolhouse et al. | ............ | 438/33 |
| 5,393,711 A * | 2/1995 | Biallas et al. | ................ | 438/458 |
| 5,972,781 A | 10/1999 | Wegleiter et al. | | |
| 6,271,102 B1 | 8/2001 | Brouillette et al. | | |
| 6,294,439 B1 | 9/2001 | Sasaki et al. | | |
| 6,337,258 B1 | 1/2002 | Nakayoshi et al. | | |
| 6,440,859 B1 * | 8/2002 | Peng et al. | .................. | 438/700 |
| 6,448,151 B2 | 9/2002 | Tateishi | | |
| 6,448,153 B2 | 9/2002 | Siniaguine et al. | | |
| 6,498,074 B2 * | 12/2002 | Siniaguine et al. | .......... | 438/460 |

(Continued)

FOREIGN PATENT DOCUMENTS

CN 1201998 A 12/1998

(Continued)

OTHER PUBLICATIONS

Notification of Argument Submission issued by the Korean Patent Office on Mar. 9, 2006, for Korean Patent Application No. 2004-0034512, and English-language translation thereof.

(Continued)

*Primary Examiner*—Kenneth A Parker
*Assistant Examiner*—Jose R Diaz
(74) *Attorney, Agent, or Firm*—Finnegan, Henderson, Farabow, Garrett & Dunner, L.L.P.

(57) ABSTRACT

A semiconductor device includes: a substrate having a main surface, a rear surface and four side surfaces; a semiconductor element formed on the main surface of the substrate; a notch formed in at least one bottom part of the side surfaces of the substrate; and a curved surface provided at an intersection of a side surface of the notch and the rear surface of the substrate.

8 Claims, 15 Drawing Sheets

U.S. PATENT DOCUMENTS

| | | | |
|---|---|---|---|
| 6,680,241 | B2 | 1/2004 | Okamoto et al. |
| 6,777,820 | B2 * | 8/2004 | Chiba et al. .................. 257/797 |
| 6,995,032 | B2 * | 2/2006 | Bruhns et al. .................. 438/33 |
| 7,012,012 | B2 | 3/2006 | Yeom et al. |
| 7,052,975 | B2 * | 5/2006 | Koizumi .................... 438/460 |
| 2001/0055856 | A1 | 12/2001 | Tao |
| 2003/0060024 | A1 | 3/2003 | Imori |
| 2006/0121697 | A1 | 6/2006 | Fujii et al. |

FOREIGN PATENT DOCUMENTS

| | | |
|---|---|---|
| CN | 1288257 A | 3/2001 |
| EP | 0 884 771 A2 | 12/1998 |
| EP | 1 085 569 A1 | 3/2001 |
| JP | 2-105405 | 4/1990 |
| JP | 10-321487 | 12/1998 |
| JP | 2000-340530 | 12/2000 |
| JP | 2003-100666 | 4/2003 |
| KR | 2003-0026867 | 4/2003 |
| WO | WO 03/015976 A1 | 2/2003 |

OTHER PUBLICATIONS

Office Action issued by the Chinese Patent Office on Nov. 11, 2005, for Chinese Patent Application No. 2004100347579.

Notification of Reason for Rejection issued by the Japanese Patent Office on Nov. 18, 2008, for Japanese Patent Application No. 2003-138889, and English-language translation thereof.

* cited by examiner

SEMICONDUCTOR DEVICE AND MANUFACTURING METHOD THEREOF

This is a division of application Ser. No. 10/845,232, filed May 14, 2004 now U.S. Pat. No. 7,217,640, which is incorporated herein by reference.

CROSS REFERENCE TO RELATED APPLICATION

This application claims benefit of priority under 35USC § 119 to Japanese Patent Application No. 2003-138889, filed on May 16, 2003, the content of which are incorporated by reference herein.

BACKGROUND OF THE INVENTION

1. Field of the Invention

The present invention relates to a semiconductor device and a manufacturing method thereof, and relates, for example, to a shape of a semiconductor chip having excellent deflecting strength and a manufacturing method thereof.

2. Related Background Art

A manufacturing process of a semiconductor device includes a dicing step to cut a semiconductor wafer by use of a blade or the like so as to divide the semiconductor wafer into pieces after element formation.

One example of the conventional dicing step will be described as a first conventional example referring to FIGS. 30 to 37. It should be noted that the same reference numerals are given to the same parts in the following drawings, and therefore repeated explanation of those parts will be described only when necessary.

First, as shown in FIG. 30, a protection tape PT is affixed to an element formation surface (hereinafter referred to as a main surface) 100MS of a semiconductor wafer W, and then a rear surface of the semiconductor wafer W is polished by mechanical grinding or etching using a grindstone 210 or the like to finish with a predetermined thickness, as shown in FIG. 31. It should be noted that in the present application, the term "etching" is used to express not only chemical processing, but also chemical mechanical polishing (CMP).

Next, a dicing tape DT is affixed to the rear surface of the semiconductor wafer W and attached to a wafer ring WR, and then a product to be processed is flipped over (transferred) to peel off the protection tape PT on the main surface 100MS, as shown in FIG. 32. Subsequently, as shown in FIG. 33, the semiconductor wafer W is cut by use of a blade BD or the like from its main surface 100MS along dicing lines provided on the main surface 100MS in accordance with the size of semiconductor chips, thereby dividing the semiconductor wafer W into pieces as shown in FIG. 34. The dicing tape DT affixed to the rear surface of the semiconductor wafer W prevents the semiconductor chips from being scattered after wafer division.

In the dicing method described above, chipping attributed to mechanical cutting has frequently occurred at edge portions where the rear surface and side surfaces of the semiconductor chip cross due to cutting for wafer division. For example, as shown in a perspective view of FIG. 35, a number of chippings CP are caused at the edge portions where side surfaces 100SA to 100SD and a rear surface 100RS of a semiconductor chip 100 cross, and their sizes range from about 1 μm to about 60 μm, with an average of about 20 μm.

FIG. 36 is a photograph of the semiconductor chip 100 taken from its rear surface side in a direction of an arrow AR90 of FIG. 34 before the semiconductor chip 100 is removed from the dicing tape DT. FIG. 37 is a photograph of an intersection of the side surface 100SA and the rear surface 100RS taken in a direction of an arrow AR100 of FIG. 35. FIG. 37 clearly shows occurrence of a chipping 100CP.

Such a chipping significantly affects deflecting strength (bending strength) of a semiconductor element, causes defects in, for example, an assembly process for packaging the semiconductor element, and decreases a final product yield ratio.

In order to prevent the chipping described above, a technique has been proposed in which a groove is formed along the dicing lines in advance to prevent the chipping, and thereafter the semiconductor wafer is cut along the groove to hold the chipping inside the groove so as to reduce an influence to the wafer surface (e.g., Japanese Patent Publication Laid-open No. 2003-100666).

However, the dicing step according to a second conventional example disclosed in Japanese Patent publication Laid-open No. 2003-100666 is not a technique to eliminate the chipping itself. Indeed, it can reduce the influence to the wafer surface, but leaves a problem that a chipping 150CP still occurs, for example, as shown in photographs of FIG. 38 and FIG. 39.

BRIEF SUMMARY OF THE INVENTION

According to a first aspect of the present invention, there is provided a semiconductor device comprising:

a substrate having a main surface, a rear surface and four side surfaces;

a semiconductor element formed on the main surface of the substrate;

a notch formed in at least one bottom part of the side surfaces of the substrate; and a curved surface provided at an intersection of a side surface of the notch and the rear surface of the substrate.

According to a second aspect of the present invention, there is provided a manufacturing method of a semiconductor device comprising:

forming a groove along a dicing line in a semiconductor wafer; the semiconductor wafer having a first surface on which a semiconductor element is formed and a second surface opposite to the first surface, the groove being formed on the second surface and having a depth associated with a final chip thickness, polishing the semiconductor wafer from the second surface side to the extent that part of the groove is left; and cutting the semiconductor wafer from the first surface side along the dicing lines and dividing the semiconductor wafer into chips.

DETAILED DESCRIPTION OF THE INVENTION

Some of embodiments of the present invention will hereinafter be described in reference to the drawings.

(1) FIRST EMBODIMENT

Figure 1:
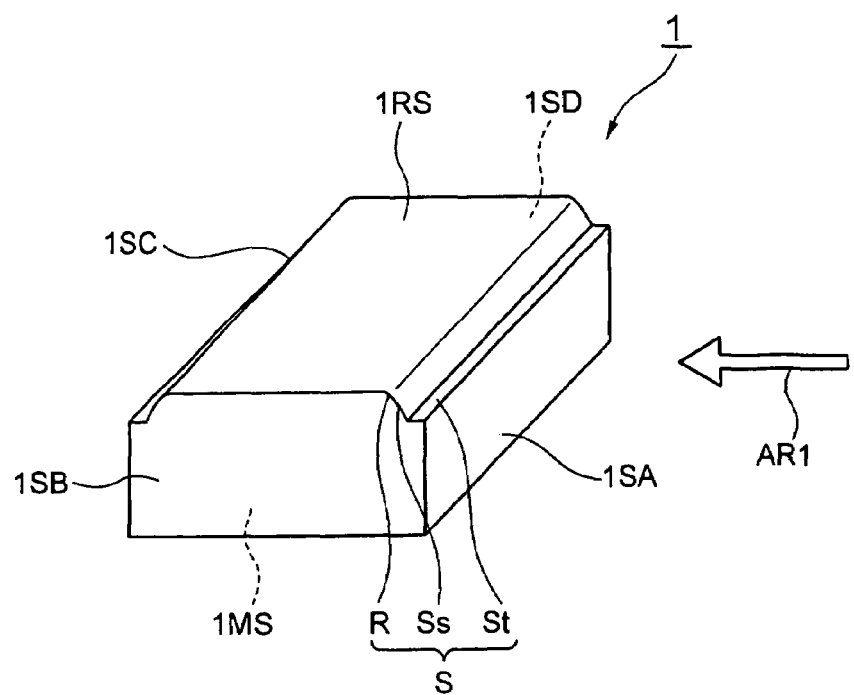
FIG. 1 is a perspective view showing a first embodiment of a semiconductor device according to the present invention.

FIG. 1 is a perspective view showing a first embodiment of a semiconductor device according to the present invention. This diagram illustrates a semiconductor chip 1 of the present embodiment disposing its rear surface side upward on paper, and disposing a main surface side on, which a semiconductor element is formed downward on paper. Notches S are provided in a bottom part (upper part of the paper) of side surfaces 1SA to 1SD of the semiconductor chip 1 such that steps are formed in portions where the side surfaces 1SA to 1SD and a rear surface 1RS cross, and edge portions where side surfaces Ss of the notches S and the rear surface, RS of the semiconductor chip 1 cross are rounded by polishing to be curved surfaces R.

It has been found out from experiments that a curvature radius CR (see FIG. 14) of a curved surface R is desirably within a range of about 0.5 µm to about 50 µm. This will be more specifically described referring to FIG. 2.

Figure 2:
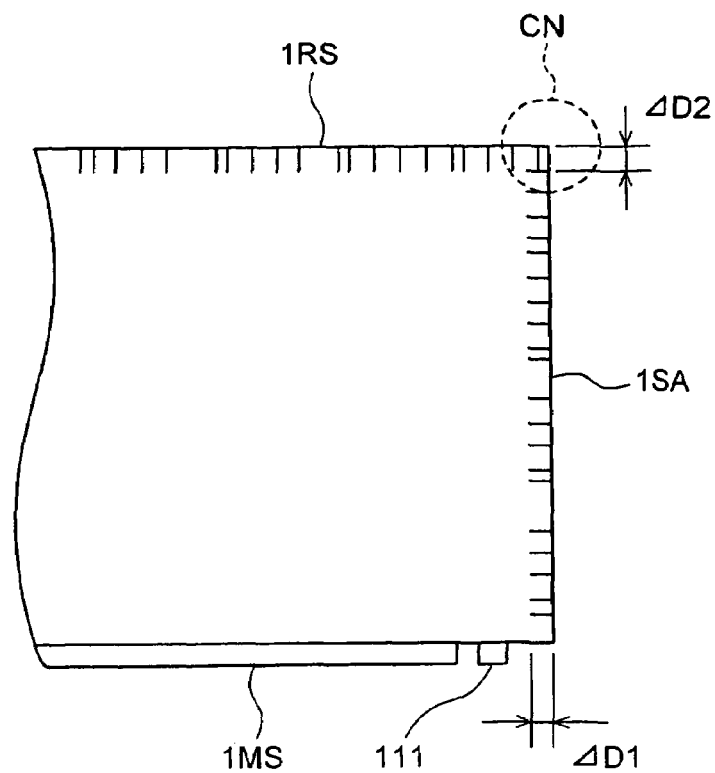
FIG. 2 is a diagram explaining a preferred numerical range for a curvature radius of a curved surface of a semiconductor chip shown in FIG. 1.

As shown in FIG. 2, depths of flaws (crushed layer) ΔD1 and ΔD2 caused to the semiconductor chip 1 in a dicing process are about 0.5 µm. Therefore, an influence of damages due to chipping can be reduced by processing the portion of the semiconductor chip 1 where the side surfaces 1SA to 1SD and the rear surface 1RS cross into a shape having a curvature radius of at least 0.5 µm.

Furthermore, the curved surfaces R can inhibit a stress due to a difference in thermal expansion coefficients between a package material and the semiconductor chip 1 from concentrating on the edge of the semiconductor chip 1, for example, during pickup in a mounting process to a lead frame or a TAB tape or after sealing. Therefore, deflecting strength can be enhanced in such a respect.

It has been proved by experiments that, for example, when the thickness of the semiconductor chip 1 is 20 µm to 40 µm, the curvature radius CR is preferably about 20 µm, and a deflecting strength of 1 GPa can be obtained which is close to the strength of silicon itself. Further, depending upon the thickness of the semiconductor chip 1, cracks might be caused if pressure is applied to a bonding pad 111 formed on the main surface 1MS of the semiconductor chip 1 in, for example, a wire bonding process, when the curvature radius CR is beyond 50 µm. The upper limit of the curvature radius CR is preferably set at about 50 µm so as to restrict such a strength decrease of the semiconductor chip 1. The curvature radius CR is more suitably 0.5 µm to 20 µm, and still more suitably 1 µm to 20 µm.

In addition, the curved surfaces R are desirably formed without having an inflexion point so as to restrict stress concentration.

A manufacturing method of the semiconductor chip 1 shown in FIG. 1 will be described referring to FIGS. 3 to 13.

Figure 3:
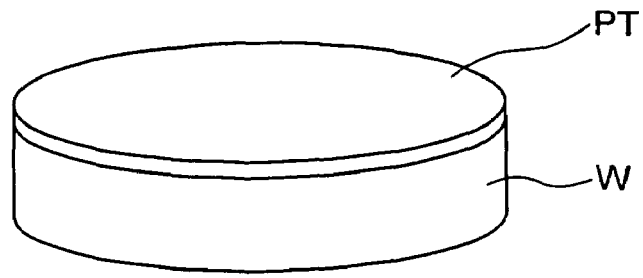
FIGS. 3 to 5 are explanatory diagrams of a manufacturing method of the semiconductor chip shown in FIG. 1.
Figure 4:
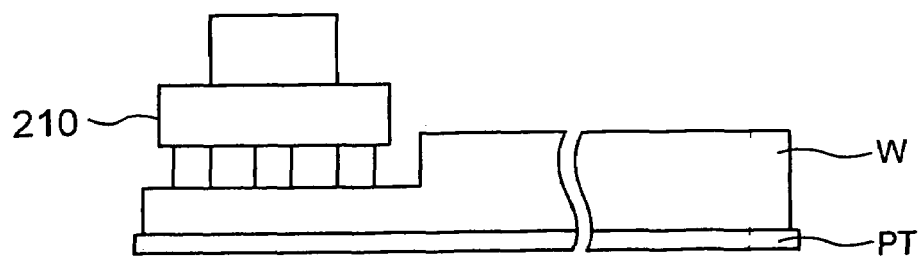

First, as shown in FIG. 3, a protection tape PT is affixed to the main surface of a semiconductor or wafer W as in a conventional technique, and then a rear surface of the semiconductor wafer W is ground by mechanical processing using a grindstone 210 or the like, chemical processing, or chemical mechanical processing, as shown in FIG. 4. This grinding is executed to reach a depth Corresponding to {final thickness Tf of the semiconductor chip (see FIG. 5)+etching removal amount (removing amount) in rear surface polishing described later}.

Figure 5:
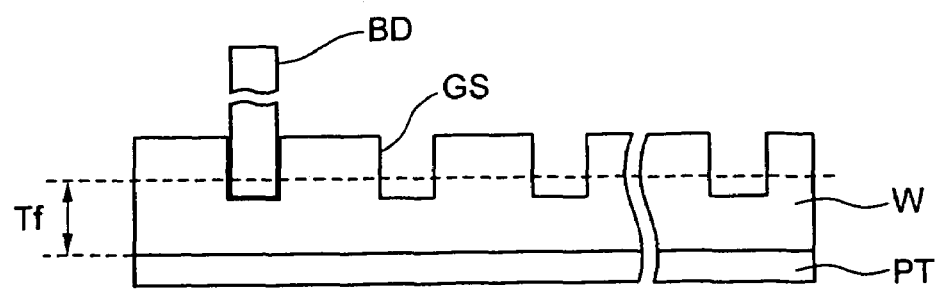

Next, a groove Gs having a predetermined width is formed to a predetermined depth in accordance with the size of the semiconductor chip by use of a blade BD or the like, as shown in FIG. 5. The position of the groove can be specified by detecting dicing lines on the main surface of the semiconductor wafer through processing of an image of the dicing lines that is picked up from the main surface side. Alternatively, for example, the position of the groove can also be specified by forming in advance alignment marks corresponding to the dicing lines on the main surface 1MS of the semiconductor wafer W and then detecting the alignment marks with an infrared camera (not shown) from the rear surface 1RS side of the semiconductor wafer W.

Figure 6:
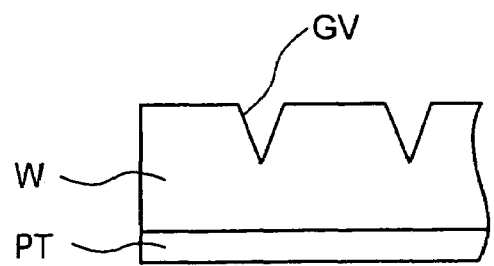
FIG. 6 is a sectional view showing another example of a groove formed in a rear surface of a semiconductor wafer.

The depth of the groove Gs can optionally be selected in a range of about 1 µm to about half of the final thickness Tf, and the width of the groove Gs can optionally be selected in a range of about 3 µm to about one third of an element size. In addition, the trench-shaped groove Gs is formed whose side surface is almost vertical to the main surface 1MS or the rear surface 1RS of the wafer W in the present embodiment. However, the shape of the groove is not limited thereto, and the groove may have its side surface at certain amount of angles with the main surface 1MS or the rear surface 1RS of the wafer W, and for example, a groove Gv having a V-shaped section as shown in FIG. 6 may also be employed.

Figure 7:
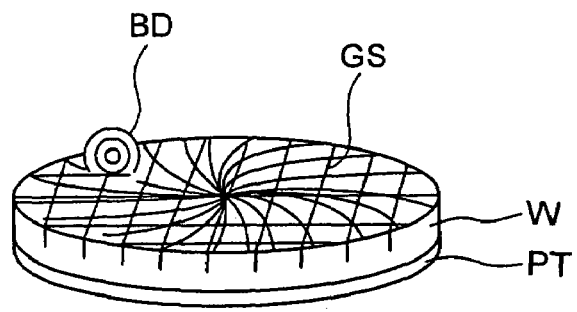
FIGS. 7 to 13 are explanatory diagrams of the manufacturing method of the semiconductor chip shown in FIG. 1.
Figure 8:
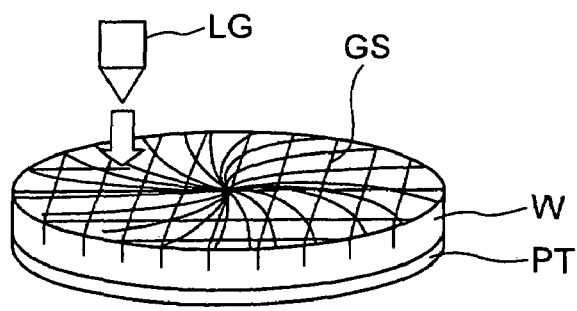

A method of forming the groove Gs may include, for example, the use of mechanical cutting with the blade BD or the like as shown in FIG. 7, but is not limited thereto. For example, a method using laser processing with a laser gun LG or chemical etching processing may be employed, as shown in FIG. 8.

Figure 9:
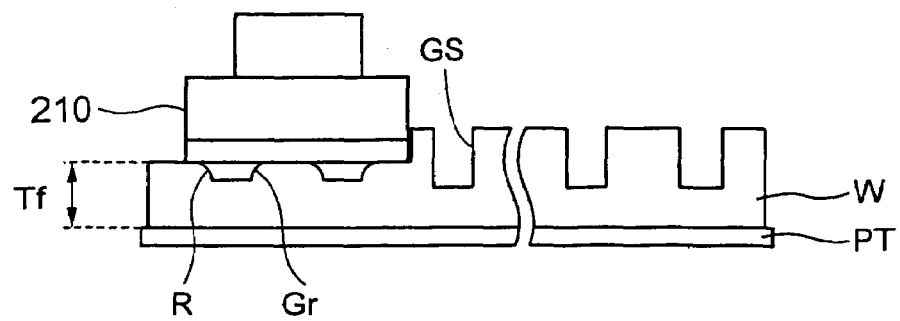
Figure 10:
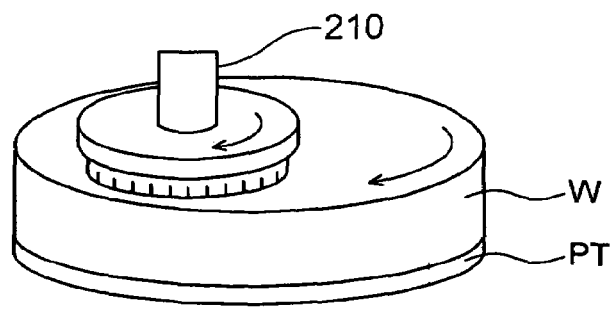

Next, as shown in FIG. 9, the semiconductor wafer W is processed from the rear surface side thereof by the mechanical cutting or etching to reach the final thickness Tf. In this way, an edge portion where a side surface of the groove Gs formed on the rear surface side and the rear surface 1RS of the semiconductor wafer W cross is rounded, whereby the groove Gs becomes a groove Gr having a curved surface R in a bottom part of the side surface (upwards in FIG. 9). This processing can be achieved by mechanical polishing using the grindstone 210 as shown in FIG. 10. However, it is not limited thereto, and any method can be used including gas etching, wet etching, plasma etching or RIE (reactive ion etching), or chemical mechanical polishing (CMP), and the highest effect can be obtained if the chemical mechanical polishing (CMP) is used.

Figure 11:
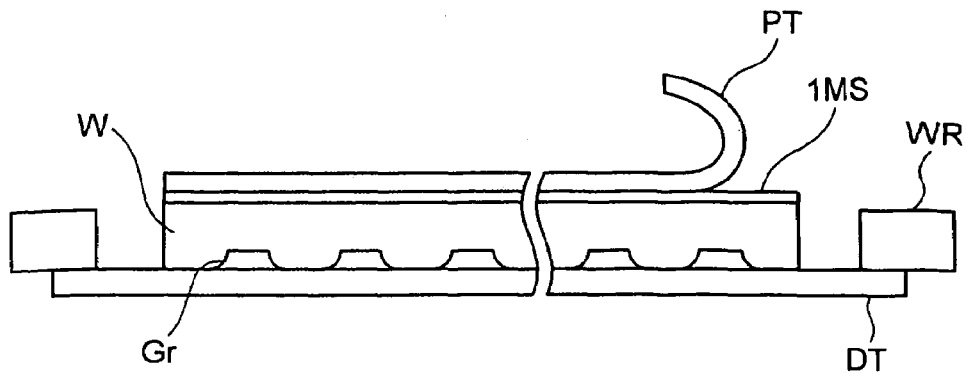

Next, a dicing tape DT is affixed to the rear surface side of the semiconductor wafer W, and the semiconductor wafer W is flipped over (transferred) as shown in FIG. 11 so that the main surface side faces up, and then the protection tape PT on the main surface side is peeled off. It should be noted that the dicing tape DT may be affixed to the rear surface after the protection tape PT on the main surface side of the semiconductor wafer W is first peeled off.

Figure 12:
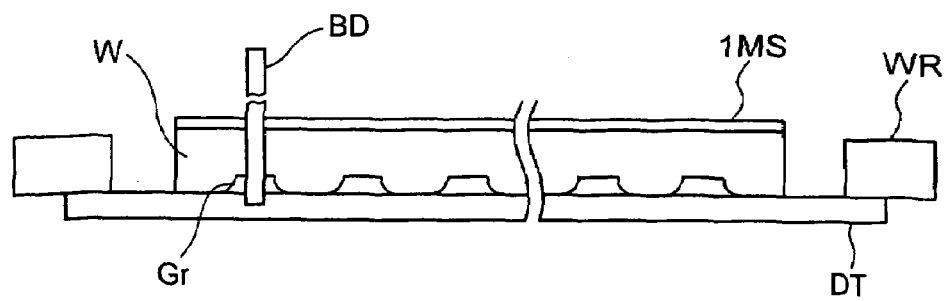
Figure 13:
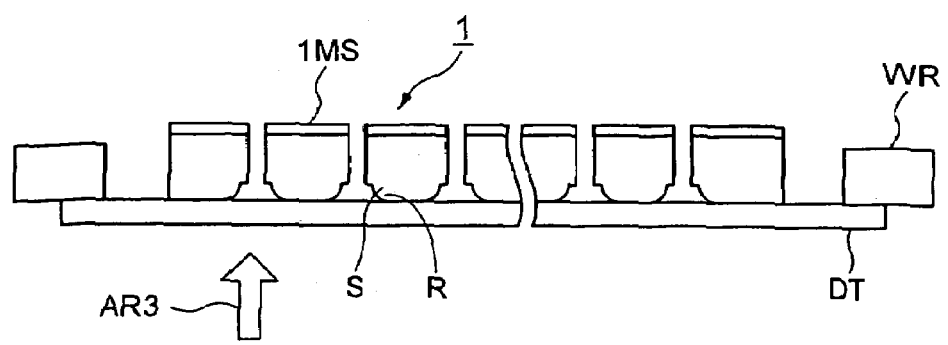

Subsequently, as shown in FIG. 12, the semiconductor wafer W is cut from its main surface side in accordance with the chip size, thus the semiconductor wafer W is divided into the semiconductor chips 1, as shown in FIG. 13. In the cutting process for this wafer division, any one of or any combination of the mechanical processing with the blade BD, processing with a laser beam, and chemical processing such as etching can be utilized as mention above. Moreover, the cutting may be stopped immediately before a bottom surface of the groove Gr, and the semiconductor wafer may be divided by cleavage.

Finally, the semiconductor chips 1 are removed from the dicing tape DT.

Figure 14:
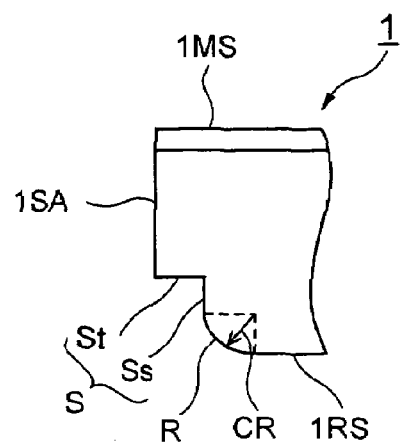
FIG. 14 is a side view more specifically showing essential parts of the semiconductor chip shown in FIG. 1.

The semiconductor chip 1 thus obtained is provided with the notch S in the bottom part of the side surfaces 1SA to 1SD, respectively as shown in a side view of FIG. 14, so that a step is formed. The notch S has a top surface St substantially in parallel with the main surface 1MS or the rear surface 1RS of the semiconductor substrate, and the side surface Ss substantially in parallel with the side surfaces 1SA to 1SD. Further, a curved surface having the curvature radius CR is formed in an edge portion where the side surface Ss of the notch S and the rear surface 1RS of the semiconductor substrate cross.

Figure 15:
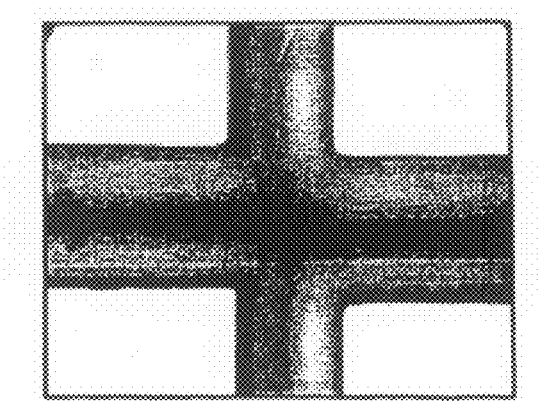
FIG. 15 is one example of a photograph of the semiconductor wafer divided into chips in FIG. 13 taken in a direction of an arrow in FIG. 13.
Figure 16:
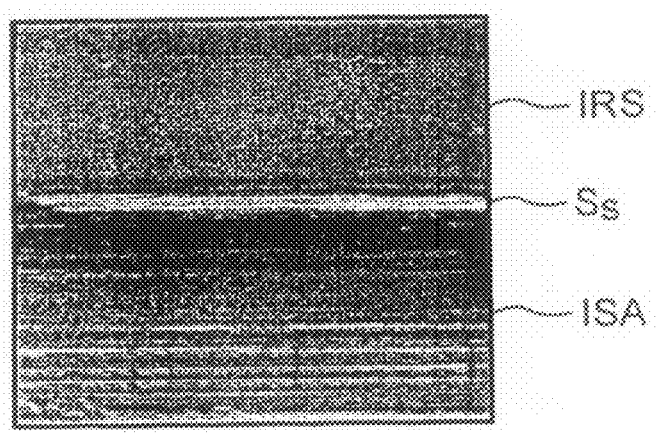
FIG. 16 is one example of a photograph of the semiconductor chip shown in FIG. 1 taken in a direction of an arrow in FIG. 1.

FIG. 15 is one example of a photograph of the semiconductor wafer W divided into chips, 1 in FIG. 13 taken in a direction of an arrow AR3 in FIG. 13, and FIG. 16 is one example of a photograph of the semiconductor chip 1 shown in FIG. 1 taken in a direction of an arrow AR1 in FIG. 1.

As described above, according to the present embodiment, the notch is provided in the bottom part of the side surfaces of the semiconductor chip 1, and the curved surface is provided at an intersection of a side surface of the notch and the rear surface of the semiconductor chip 1, so that the semiconductor chip having a configuration free of the chipping is provided, as apparent from an area in the vicinity of the side surface Ss of the notch S in FIG. 16. This makes it possible to prevent the occurrence of defects such as element cracks in an assembly process of a semiconductor package, and improves reliability of the semiconductor package.

Furthermore, according to the present embodiment, since the steps produced by the notches are provided on the rear surface as described above, it is possible to prevent a connection failure in the wire bonding and an increase in the size of a package due to expansion in an adhesive bonding area of an envelope such as a frame which are caused by an adhesive expanding over the chip size or climbing up to an element surface, when the semiconductor chip 1 is mounted on a wiring board or adhesively bonded to the envelope. As a result, size of an end product can be further reduced.

Figure 17:
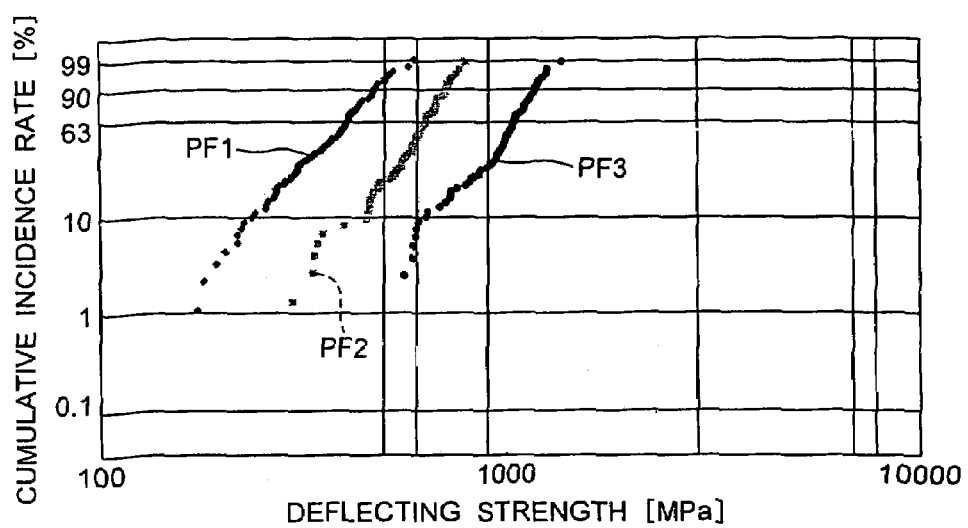
FIG. 17 is a graph showing the relationship between deflecting strength of the semiconductor chip shown in FIG. 1 and a cumulative incidence rate of defects in comparison with conventional examples.

FIG. 17 is a graph showing profiles which represent the relationship between the deflecting strength of the semiconductor chip 1 of the present embodiment and a cumulative incidence rate of defects in comparison with conventional examples. In this graph, a symbol PF3 indicates a profile of the semiconductor chip 1 of the present embodiment and symbols PF1 and PF2 indicate profiles of first and second conventional examples, respectively. It can be found out from FIG. 17 that in the present t the deflecting strength of the semiconductor chip 1 is far superior to that of the first conventional example, and is improved as compared with the second conventional example.

(2) SECOND EMBODIMENT

Figure 18:
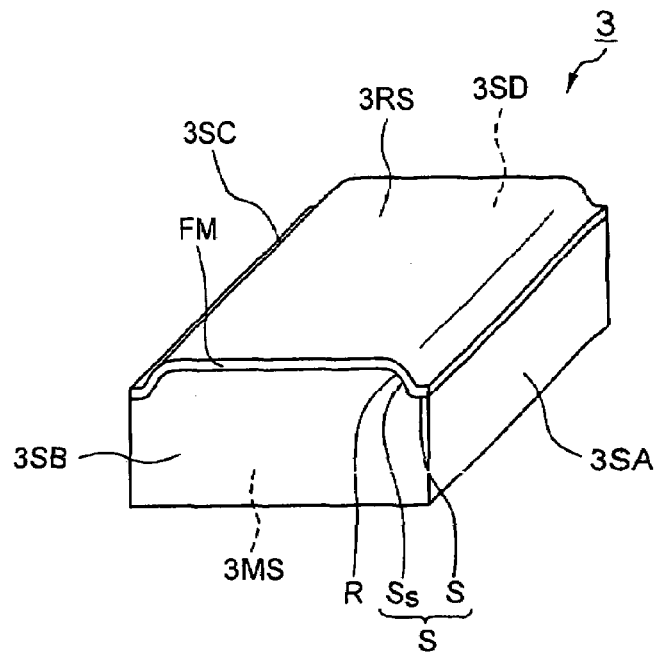
FIG. 18 is a perspective view showing a second embodiment of the semiconductor device according to the present invention.

FIG. 18 is a perspective view showing a second embodiment of the semiconductor device according to the present invention. A semiconductor chip 3 shown in FIG. 18 is characterized by further comprising a film FM formed on a rear surface 3RS side. The film FM may be an insulating film such as an oxide film or a conductive film made of nickel or the like. Configuration of other parts of the semiconductor chip 3 is substantially the same as that of the semiconductor chip 1 shown in FIG. 1.

Figure 19:
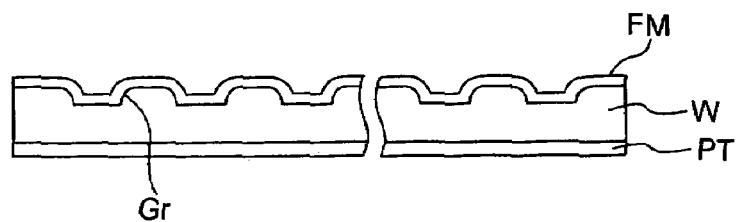
FIGS. 19 to 22 are explanatory diagrams of the manufacturing method of the semiconductor chip shown in FIG. 18.

The film FM on the rear surface 3RS side can be formed as shown in FIG. 19, for example, after the groove Gr along the dicing lines is formed and the rear surface side of the semiconductor wafer W is polished by the mechanical processing or etching so that the semiconductor wafer W has the final thickness Tf (see FIG. 9).

A manufacturing method of the semiconductor chip 3 of the present embodiment is substantially the same as the manufacturing method of the semiconductor chip 1 described above, except for the process shown in FIG. 19.

Figure 20:
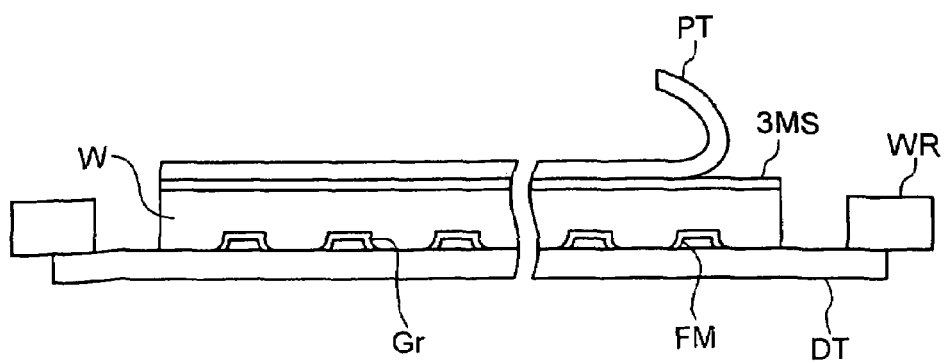
Figure 21:
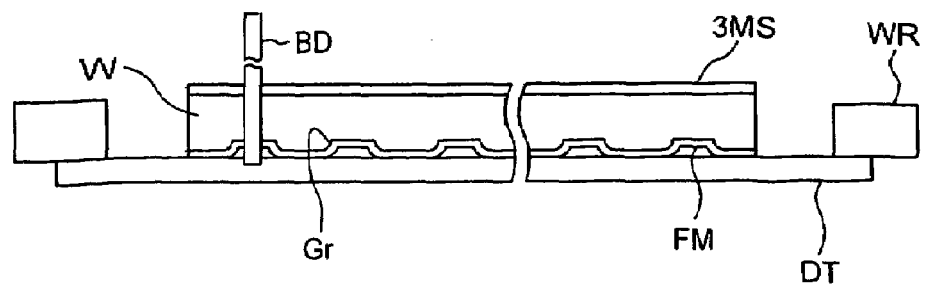
Figure 22:
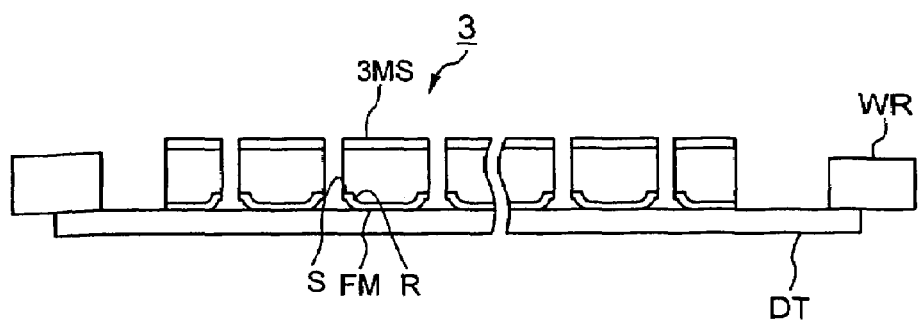

More specifically, after the film FM is formed on the rear surface 3RS, the dicing tape DT is affixed to the rear surface 3RS of the semiconductor wafer W and the semiconductor wafer W is transferred as shown in FIG. 20, and then the protection tape PT on a main surface 3MS is peeled off. Next, as shown in FIG. 21, the semiconductor wafer W is cut from the main surface 3MS side in accordance with the chip size, thus the semiconductor wafer W is divided into the semiconductor chips 3, as shown in FIG. 22. Finally, the semiconductor chips 3 are removed from the dicing tape DT.

Figure 23:
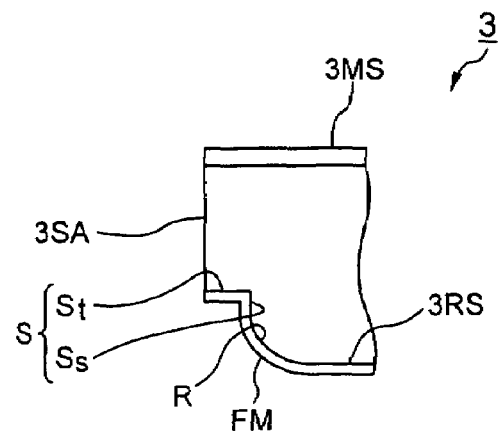
FIG. 23 is a side view more specifically showing essential parts of the semiconductor chip shown in FIG. 18.

The semiconductor chip 3 thus obtained comprises the film FM formed on the top surface St of the notch S and the rear surface 3RS, as shown in a side view of FIG. 23.

(3) THIRD EMBODIMENT

Figure 24:
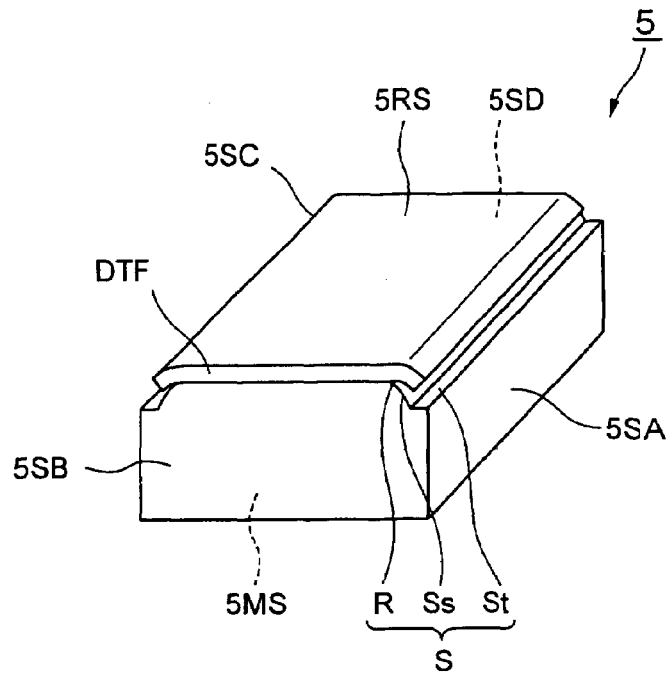
FIG. 24 is a perspective view showing a third embodiment of the semiconductor device according to the present invention.

FIG. 24 is a perspective view showing a third embodiment of the semiconductor device according to the present invention. A semiconductor chip 5 shown in FIG. 24 is characterized by comprising a die attach film DTF affixed to a rear surface 5RS of the semiconductor substrate. The die attach film DTF is cut so that it extends to an upper portions of the steps provided by the notches at an intersection of the rear surface 5RS and side surfaces 5SA to 5SD of the semiconductor substrate. Configuration of other parts of the semiconductor chip 5 in the present embodiment is substantially the same as that of the semiconductor chip 1 shown in FIG. 1.

A manufacturing method of the semiconductor chip 5 shown in FIG. 24 will simply be described referring to the drawings.

First, as in the first embodiment described above, after the protection tape PT is affixed to a main surface 5MS of the semiconductor wafer W, the semiconductor wafer W is ground from a rear surface 5RS side to reach a predetermined depth, and the groove Gs having the predetermined width is formed to a predetermined depth in accordance with the size of the semiconductor chip (see FIGS. 3 to 8). Further, the semiconductor wafer W is polished from the rear surface 5RS side by the mechanical processing or etching to reach the final thickness Tf, thereby obtaining the groove Gr having the curved surface R at an edge portion where a side surface of the groove Gs formed on the rear surface 5RS side and the rear surface 3RS of the semiconductor wafer W cross (see FIG. 9 and FIG. 10).

Figure 25:
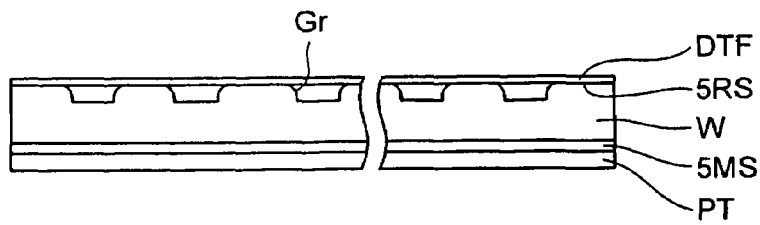
FIGS. 25 to 28 are explanatory diagrams of the manufacturing method of the semiconductor chip shown in FIG. 24.
Figure 26:
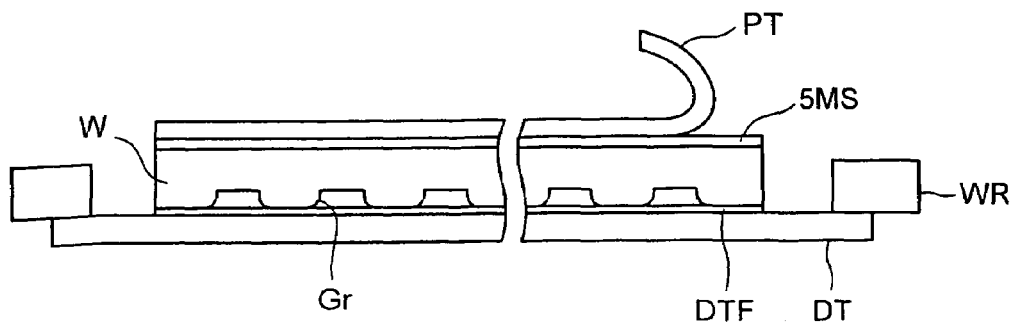

Next, as shown in FIG. 25, after the die attach film DTF is affixed to the rear surface 5RS of the semiconductor wafer W, the dicing tape DT is affixed (see FIG. 26). It should be noted that instead of the above process, if a dicing tape integrally formed with the die attach film is available, this can be affixed to eliminate one of the processes.

Figure 27:
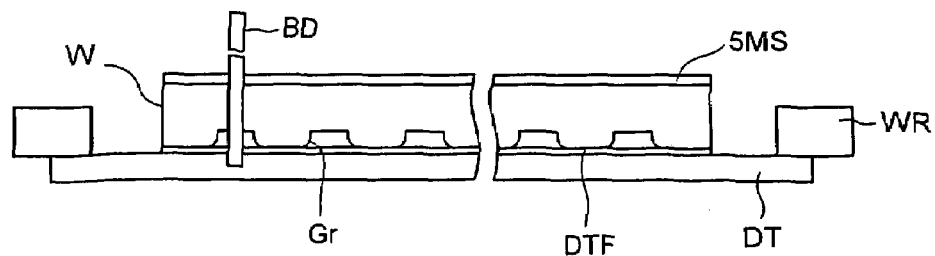
Figure 28:
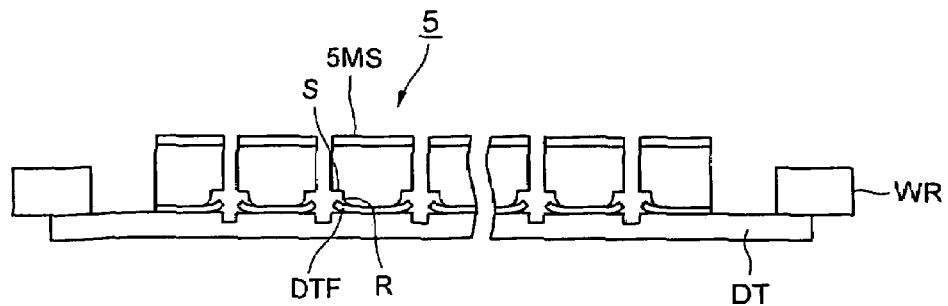
Figure 29:
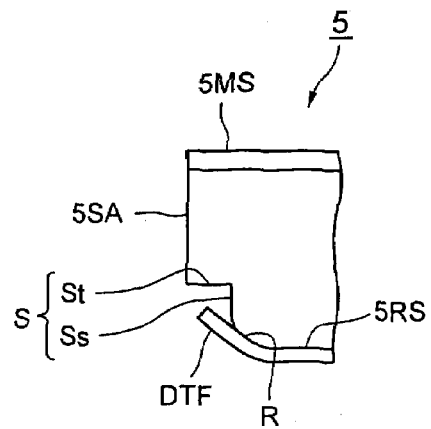
FIG. 29 is a side view more specifically showing essential parts of the semiconductor chip shown in FIG. 24.
Figure 30:
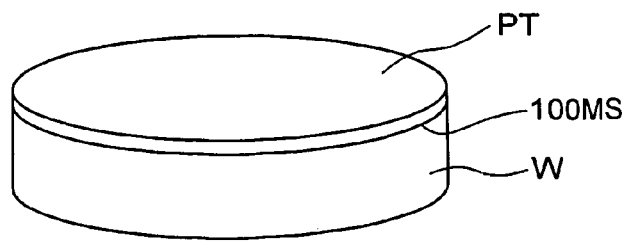
FIGS. 30 to 34 are explanatory diagrams of one example of a dicing method according to a conventional technique.
Figure 31:
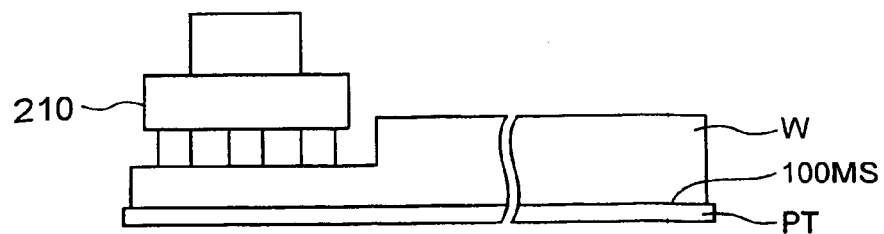
Figure 32:
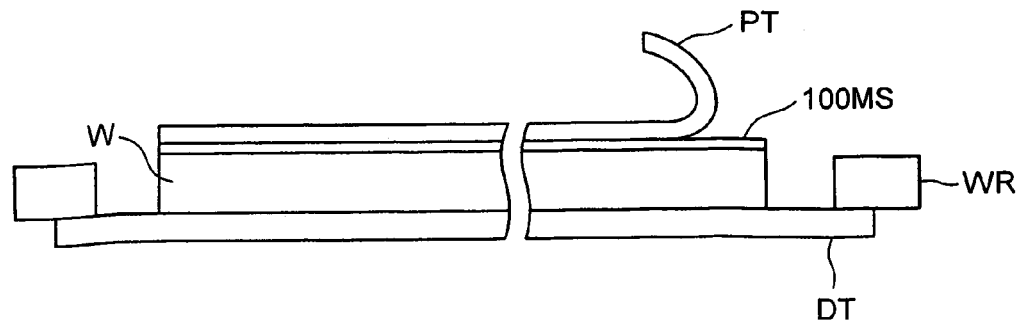
Figure 33:
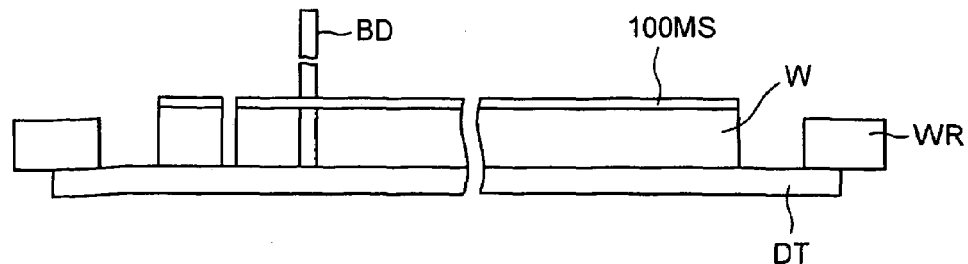
Figure 34:
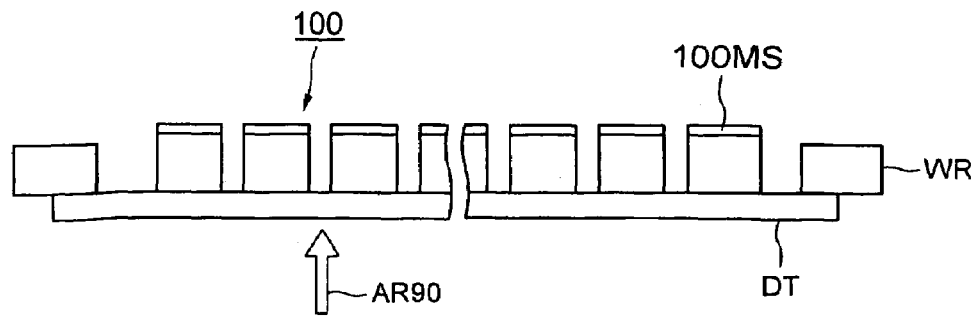
Figure 35:
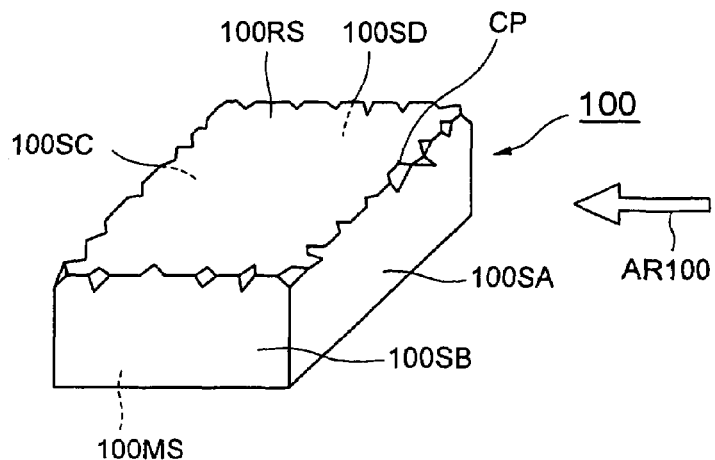
FIG. 35 is a perspective view of one example of the semiconductor chip manufactured by the process method shown in FIGS. 30 to 34.
Figure 36:
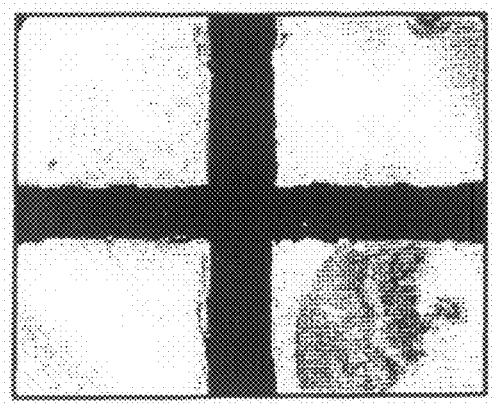
FIG. 36 is one example of a photograph of the semiconductor wafer taken in a direction of an arrow in FIG. 34.
Figure 37:
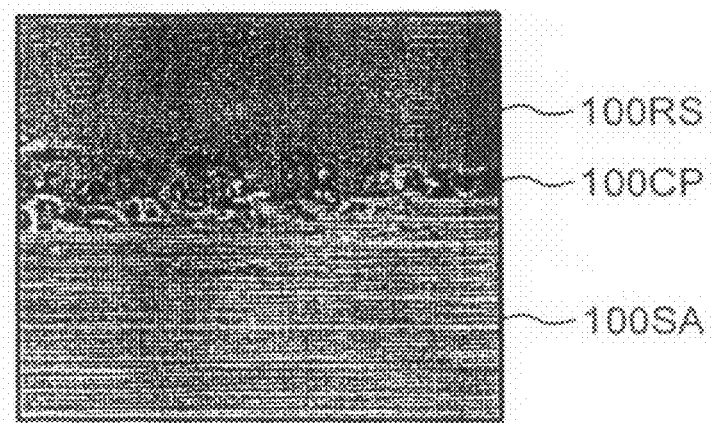
FIG. 37 is one example of a photograph, of the semiconductor chip taken in a direction of an arrow in FIG. 35.
Figure 38:
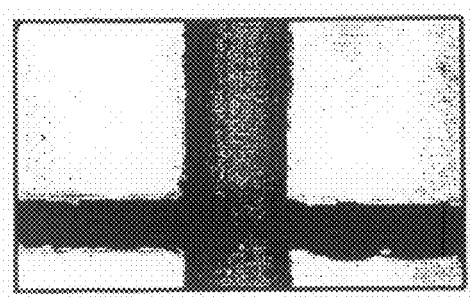
FIG. 38 is one example of a photograph of the semiconductor wafer in a second conventional example taken in the direction similar to that of FIG. 36.
Figure 39:
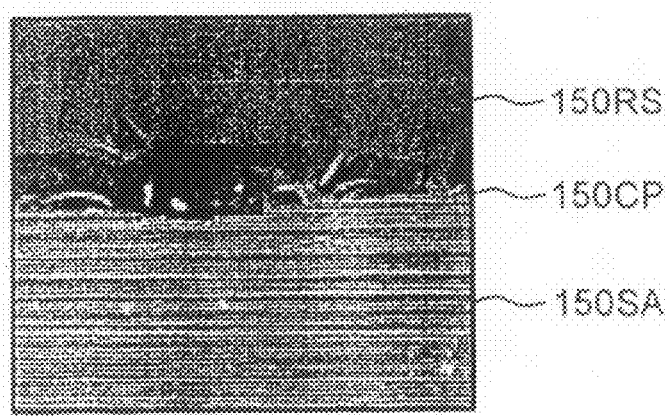
FIG. 39 is one example of a photograph of the semiconductor chip in the second conventional example taken in the direction similar to that of FIG. 37.

Subsequently, the semiconductor wafer W is flipped over as shown in FIG. 26, and the protection tape PT on the main surface 5MS is peeled off, and then the semiconductor wafer W is cut from the main surface 5MS side in accordance with the chip size as shown in FIG. 27, thereby dividing the semiconductor wafer W into the semiconductor chips 5, as shown in FIG. 28. Finally, the semiconductor chips 5 are removed from the dicing tape DT, whereby the semiconductor chip 5 can be obtained which comprises the die attach film DTF extending from the rear surface 5RS into the notch S via the curved surface R, as shown in a side view of FIG. 29.

The embodiments of the present invention have been described above, but the present invention is not limited to the above embodiments, and various modifications can of course be made within its scope and spirit. For example, it has been described in the above embodiments that the protection tape PT is attached to a wafer ring WR, but the wafer ring WR does not always need to be used. Further, if the rear surface of the semiconductor chip is mirror-finished, minute unevenness such as striations due to polishing can be removed, and the deflecting strength can further be enhanced. Still further, the groove Gs along the dicing lines is formed after the rear surface of the semiconductor wafer W is polished in the above-described embodiments, but this is not a limitation, and the groove Gs may be formed with predetermined thickness and width on the rear surface of the semiconductor wafer W before the rear surface of the semiconductor wafer W is subjected to some kind of processing.

What is claimed is:

1. A semiconductor device comprising:
   a semiconductor chip having a main surface, a rear surface and four side surfaces, a semiconductor element being formed on the main surface; and
   a step formed in at least one bottom part of the side surfaces of the semiconductor chip,
   wherein the step is formed by a first surface substantially in parallel with the main surface of the chip, a second surface intersecting the first surface, and a curved surface that is continuous with the second surface and intersects the rear surface of the chip.

2. The semiconductor device according to claim 1, further comprising:
   a conductive film or an insulating film formed on the rear surface of the substrate.

3. The semiconductor device according to claim 1, further comprising:
   an adhesive film affixed to a rear surface side of the substrate.

4. The semiconductor device according to claim 1, wherein the step is formed so that the first and second surfaces are substantially perpendicular to each other.

5. A method of manufacturing the semiconductor device according to claim 1, wherein the step is formed by mechanical processing, chemical processing, or chemical mechanical processing.

6. The semiconductor device according to claim 1, wherein the curved surface has a curvature radius of approximately 0.5 µm to approximately 50 µm.

7. The semiconductor device according to claim 1, wherein the curved surface is formed so that formation of an inflexion point is avoided.

8. The semiconductor device according to claim 1, wherein the dimension of the rear surface of the substrate is smaller than that of the main surface of the substrate.

* * * * *